United States Patent

Kaneko et al.

[11] Patent Number: 6,084,387
[45] Date of Patent: Jul. 4, 2000

[54] POWER SOURCE CIRCUIT FOR GENERATING POSITIVE AND NEGATIVE VOLTAGE SOURCES

[75] Inventors: Masaki Kaneko; Hiroyuki Kobatake; Masakazu Amanai; Kazuaki Kato; Satoru Oku, all of Tokyo, Japan

[73] Assignee: NEC Corporation, Tokyo, Japan

[21] Appl. No.: 09/243,550

[22] Filed: Feb. 3, 1999

[30] Foreign Application Priority Data

Feb. 3, 1998 [JP] Japan ................................ 10-022006

[51] Int. Cl.[7] ............................................. G05F 1/40
[52] U.S. Cl. ..................................... 323/281; 323/274
[58] Field of Search ......................... 363/59, 60; 323/274, 323/281, 280; 307/110

[56] References Cited

U.S. PATENT DOCUMENTS 5,168,174  12/1992  Giovanni et al. ...................... 307/296
5,768,115  6/1998  Pascucci et al. ......................... 363/59

FOREIGN PATENT DOCUMENTS

| 0 807 936 | 11/1997 | European Pat. Off. . |
| 2 735 885 | 12/1996 | France . |
| 7-231647 | 8/1995 | Japan . |
| 10-3794 | 1/1998 | Japan . |
| 94/28629 | 12/1994 | WIPO . |

Primary Examiner—Shawn Riley
Attorney, Agent, or Firm—Foley & Lardner

[57] ABSTRACT

A power source circuit for a flash memory includes a positive circuit section for generating a positive voltage source, a source follower transistor for converting the impedance of the first voltage source, a negative circuit section for generating a negative voltage source while maintaining a voltage difference between the output of the source follower transistor and the negative voltage source at a first reference potential. The positive circuit section includes a voltage compensating transistor having a threshold voltage equal to the threshold of the source follower transistor.

6 Claims, 4 Drawing Sheets

POWER SOURCE CIRCUIT FOR GENERATING POSITIVE AND NEGATIVE VOLTAGE SOURCES

BACKGROUND OF THE INVENTION (a) Field of the Invention

The present invention relates to a power source for generating positive and negative voltage sources and, more particularly to the control of a power source circuit which generates a voltage source having a polarity inverse to the polarity of the source voltage supplied to the semiconductor device.

(b) Description of the Related Art

Flash memories are increasingly used as nonvolatile memory devices for storing programs and data. In programming or erasing a memory cell in a flash memory, a potential difference as high as 16 to 18 volts is generally applied between the source and the control gate of the memory cell.

Until recently, only a positive voltage source is generally used in the flash memory, wherein the control gate is applied with 16 to 18 volts while maintaining the source potential of the memory transistor at zero volt. In this case, the circuit line connected to the control gate must have a withstand voltage of 16 to 18 volts, which results in a large chip size due to a large element dimension for obtaining a large withstand voltage.

Recently, a negative voltage source is also used in a flash memory to reduce the potential of the positive voltage source applied to the control gate. For example, if the source voltage is −4 volts, 12 volts is sufficient for the control gate voltage to obtain a voltage difference of 16 volts. This remarkably reduces the withstand voltage of the control gate as well as the control circuit for the control gate, thereby reducing the element dimensions and the chip size of the flash memory. For this reason, a negative voltage source is generally required in the semiconductor device having a flash memory.

FIGS. 1A and 1B show the voltages applied for programming and erasing, respectively, a memory cell in a flash memory by using a known Fowler-Nordheim (F-N) tunneling effect. In the programming, electrons are withdrawn from the floating gate by applying −9 volts to the control gate and 6 volts to the source electrode, whereas in the erasing, electrons are injected into the floating gate by applying 12 volts to the control gate and −4 volts to the source electrode and the well receiving therein the memory cell.

If the negative voltage −9 volts or −4 volts fluctuates due to the unstable characteristics of the negative voltage source, the amount of electrons injected or withdrawn into/from the floating gate varies with the fluctuation of the negative voltage. For example, if the applied voltage is above −4 volts, the amount of injected electrons is less than the designed amount, which results in an eventual programmed state shifting from the erased state in the memory cell due to the leakage of the electrons with the lapse of time. This defect must be avoided in the flash memory to prevent the erroneous data from occurring by stabilizing the negative voltage source in the semiconductor device.

Patent Publication JP-A-7-231647 proposes a power source circuit used in a flash memory, such as shown in FIG. 2. The power source circuit includes a positive source section 14A for generating a positive voltage source and a negative source section 13A for generating a negative voltage source. The positive source section 14A has a charge pump 17 and a comparator CP2 for comparing the output of a voltage divider 19A, which includes capacitors C3 and C4 for dividing the output potential of the charge pump 17, against a reference voltage Vref2 for a feed-back control of the charge pump 17. The positive source section 14A generates a positive voltage of 12 volts, for example.

The negative source section 13A has a control unit 10, a charge pump 11 and a voltage divider 12A including serial capacitors C1 and C2. The control unit 10 has a comparator CP1 for comparing the output of the voltage divider 12A dividing the voltage difference between the output of the charge pump 17 and the output of the charge pump 11 against a reference voltage Vref1. The capacitances of the capacitors C1 and C2 are designed such that the output of the voltage divider 12A is positive.

If the output voltage of the voltage divider 12A is higher than the reference voltage Vref1, the charge pump 11 is activated to lower the output voltage of the charge pump 11, whereas if the output of the voltage divider 12A is lower than the reference voltage Vref1, the charge pump 11 is inactivated to stop the lowering of the output voltage thereof.

By the operations as described above, the output voltage NVpp of the negative source section 13A is clumped at a constant negative voltage NVpp for use in programming or erasing memory cells in a flash memory.

In the power source circuit of FIG. 2, the output voltage NVpp of the negative source section 13A is controlled by feedback of the output of the voltage divider 12A. In the feedback loop, the output voltage of the positive source section 14A is unstable until a considerable length of time elapses since the supplied power source is turned on for the power source circuit. Since the negative source section 13A starts before the output of the positive source section 12A becomes stable, in the transient period after the power source is turned on, both the outputs of the positive source section 14A and the negative circuit section 13A are unstable. This prolongs the time length for stabilizing by which the power source circuit generates a stable negative output voltage NVpp.

Further, if a large number of memory cells are selected in an erasing operation of the flash memory, a large current flows through the output terminal OUT of the power source circuit to the memory cells, resulting in fluctuation of the negative output voltage NVpp. Although the fluctuation may be suppressed by the comparator CP1 after a considerable length of time, the fluctuation of the negative output voltage NVpp is transferred during a transient state to the output of the positive source section 14A through the voltage divider 12A, the output of which is also transferred to the non-inverting input of the comparator CP2 and to the input of the charge pump 17. The voltage fluctuations thus transferred further prolong the time length for stabilizing the negative output voltage NVpp.

SUMMARY OF THE INVENTION

It is an object of the present invention to provide a power source circuit for generating an output voltage source used in a flash memory, such as the negative voltage source as described heretofore, the output voltage source having a stable and precise voltage.

The present invention provides a power source circuit comprising a first source section for generating a first voltage source having a first polarity, a second source section for generating a second voltage source having a second polarity opposing the first polarity, an impedance converter for receiving the second voltage source to generate a third voltage source having an output impedance different from an output impedance of the first voltage source, a first voltage divider for dividing a voltage difference between the third voltage source and the first voltage source to generate a first divided voltage having the second polarity, and a control unit for controlling a voltage of the first voltage source by maintaining the first divided voltage at a first reference voltage.

In accordance with the power source circuit of the present invention, the impedance converter suppresses the change of the output of the first voltage divider, whereby the fluctuation of the first voltage source can be stabilized in a short time after the supplied power source is turned on for the power source circuit.

The above and other objects, features and advantages of the present invention will be more apparent from the following description, referring to the accompanying drawings.

PREFERRED EMBODIMENTS OF THE INVENTION

Figure 1A:
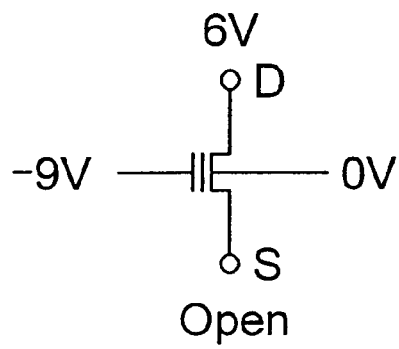
FIGS. 1A and 1B are circuit diagrams for showing voltages applied in programming and erasing a memory cell in a general flash memory.
Figure 1B:
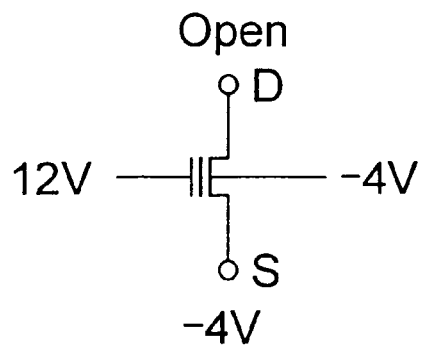
Figure 2:
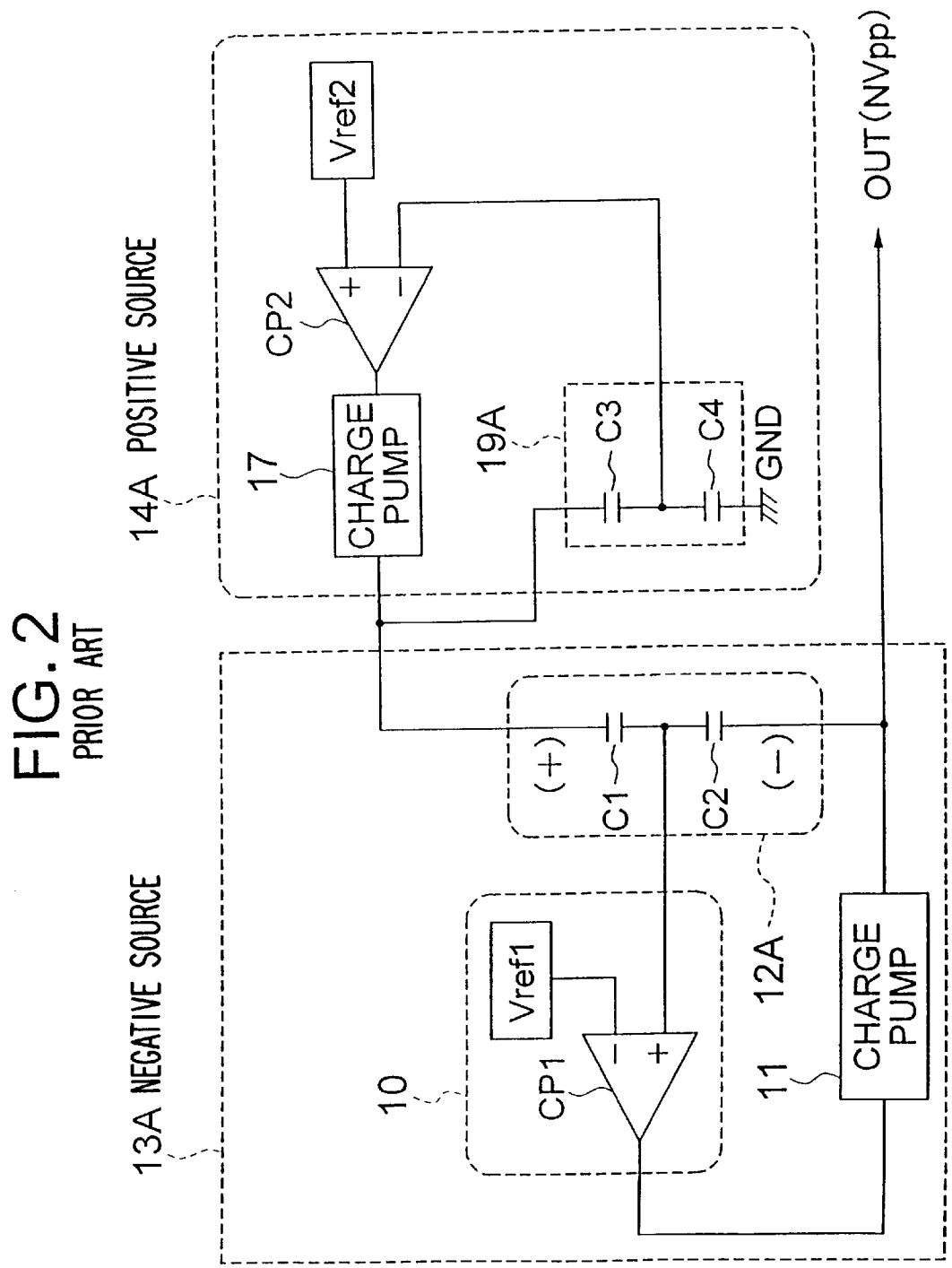
FIG. 2 is a circuit diagram of a conventional power source circuit for generating a negative voltage source.

Now, the present invention is more specifically described with reference to accompanying drawings, wherein similar constituent elements are designated by similar or related reference numerals throughout the drawings.

Figure 3:
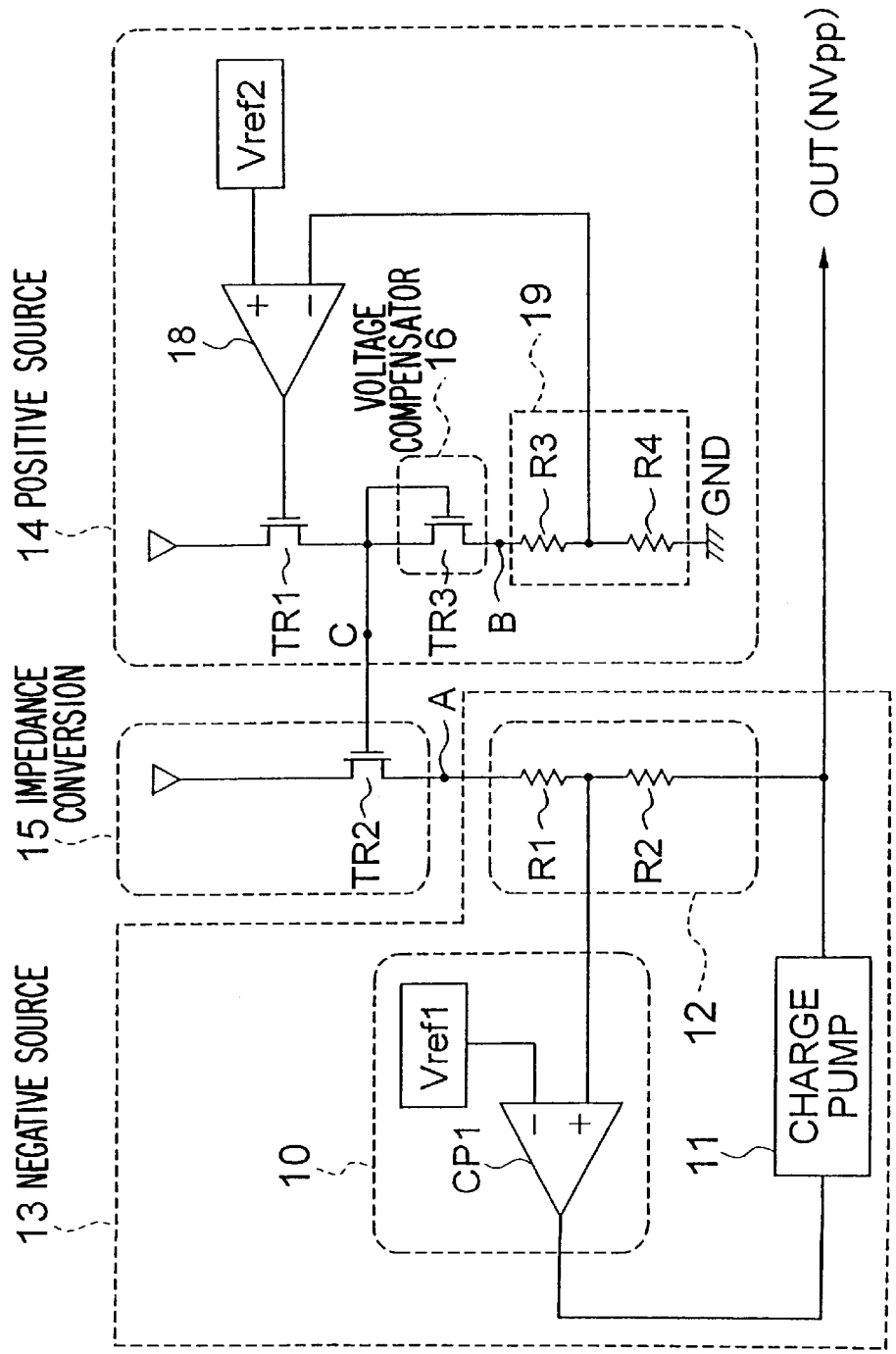
FIG. 3 is a circuit diagram of a power source circuit according to an embodiment of the present invention.

Referring to FIG. 3, a power source circuit for use in a flash memory according to an embodiment of the present invention includes a positive source section 14, a negative source section 13, and an impedance conversion section 15. The positive circuit section 14 includes a differential amplifier 18, an output transistor TR1, a voltage compensator 16 including an n-channel transistor TR2 having a drain and a gate connected together, and a voltage divider 19 including serial resistors R1 and R2. The output transistor TR1, voltage compensating transistor TR3 and the voltage divider 19 are serially connected between a source line and the ground. The differential amplifier 18 has an inverting input connected to the output of the voltage divider 19, a non-inverting input supplied with a positive reference voltage Vref2, and an output terminal connected to the gate of the output transistor TR1.

The impedance conversion section 15 is implemented by an n-channel transistor TR2 forming a source follower. The drain of the output transistor TR1 delivers the output voltage of the positive source section 14, which is supplied to the gate of the transistor TR2 in the impedance conversion section 15.

The negative source section 13 includes a control unit 10 implemented by a comparator CP1, a voltage divider 12, and a charge pump 11. The voltage divider 12 including serial resistors R1 and R2 and n-channel transistor TR2 in the impedance conversion section 15 are serially connected in this order between the source line and the output terminal of the charge pump 11. The comparator CP1 has an inverting input connected to a referenced voltage Vref1, a non-inverting input connected to the output of the voltage divider 12, and an output terminal connected to the control input of the charge pump 11, the output of which constitutes the output terminal OUT of the negative source section 13. The output of the voltage divider 12 is a positive voltage obtained by dividing the difference between the drain potential of the transistor TR2 and the output potential of the negative source section 13. The source potential of the transistor TR2 is equal to the output of the positive source section 14 minus the threshold voltage Vth of the source follower transistor TR2, which is equal to the threshold voltage of the voltage compensating transistor TR3.

The voltage compensating transistor TR3 compensates the voltage drop across the source follower transistor TR2. Generally, a MOS transistor having a drain and a gate connected together has a source voltage equal to the gate voltage minus the threshold voltage Vth of the MOS transistor. Although the differential amplifier 18 functions for maintaining the potential of the output node "C" or the source voltage of the output transistor TR1 without the voltage compensator 16, the source voltage of the source follower transistor TR2 or the potential of node "A" varies depending on the threshold voltage Vth of the source follower transistor TR2, which generally varies depending on the fabrication process or the ambient temperature for the power source circuit. By inserting the voltage compensating transistor TR3 having a drain and a gate connected together, the potential of node "A" is maintained at a constant together with the potential of node "B", although the potential of node "C" varies depending on the threshold voltage Vth of the transistor TR3.

Figure 4:
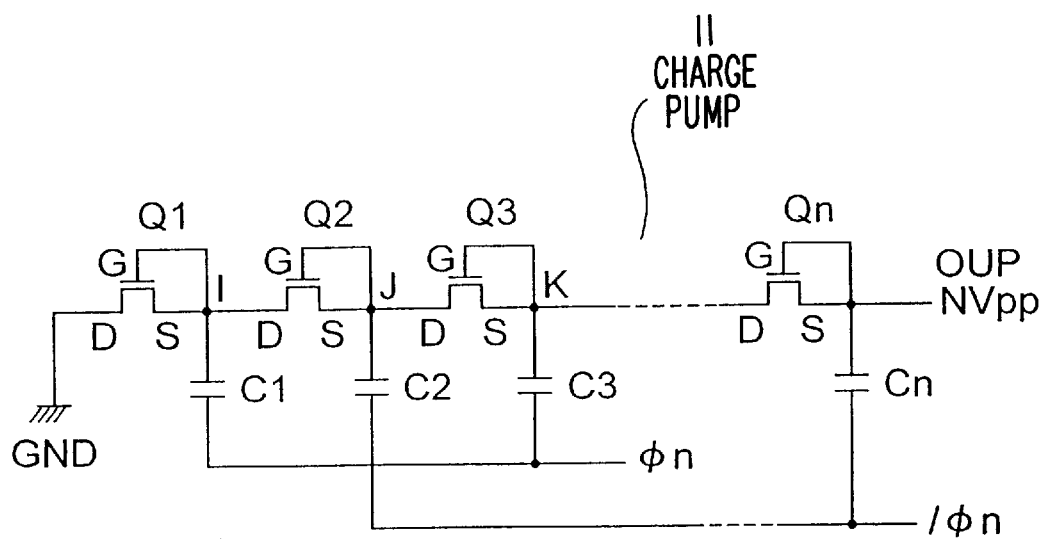
FIG. 4 is a circuit diagram of an example of the charge pump shown in FIG. 3.

Referring to FIG. 4, the charge pump 11 shown in FIG. 3 includes a plurality of serial MOS transistors Q1, Q2, . . . Qn connected in this order between the ground and the output terminal of the negative source section 13, and a plurality of capacitors C1, C2, . . . Cn disposed for respective transistors Q1, Q2, . . . Qn. Each of the MOS transistors Q1, Q2, . . . Qn has a source and a gate connected together. Each of the odd-numbered capacitors C1, C3, . . . Cn-1 is connected between the source of a corresponding one of the transistors Q1, Q3, . . . Qn-1 and a first clock line receiving a clock signal φ n, whereas each of the even-numbered capacitors C2, C4, . . . Cn is connected between the source of a corresponding one of the transistors Q2, Q4, . . . Qn and a second clock line receiving an inverted clock signal/φ n, which is complementary with the clock signal φ n.

In operation of the charge pump 11, if the output of the comparator CP1 in FIG. 3 assumes a H-level, the clock signals φ n and φ n are supplied to the capacitors C1, C3, . . . Cn-1 and capacitors C2, C4, . . . Cn, respectively, during the interval when the output of the comparator CP1 stays at the H-level.

When the clock signal φ n rises from a L-level to a H-level, the rise of the clock signal φ n is temporarily transmitted through the odd-numbered capacitors C1, C3, . . . , whereby the potentials of nodes I, K . . . , or the source voltages of odd-numbered transistors Q1, Q3 . . . , rises from the previous potential level by the amplitude of the clock pulse in the clock signal φ n. At this instant, if the raised potential of node I is higher than the ground level, transistor Q1 turns on to transfer the electric charge stored in the capacitor C1 to the ground. Similarly, if the potential of node K is higher than the potential of node J, transistor Q3 turns on to transfer the electric charge stored in the capacitor C3 to the capacitor C2.

When the clock signal/φ n rises from a L-level to a H-level, the potential of node J rises from the previous potential level by the amplitude of the clock pulse in the clock signal/φn. At this instant, if the potential of node J is higher than the potential of node I, transistor Q2 turns on to transfer the electric charge stored in the capacitor C3 to the capacitor C2. Similarly, the electric charge stored in the capacitor Ci is transferred to the capacitor Ci-1.

By iterating the above operations, the electric charge is transferred from the output terminal OUT to the ground by a pumping function of the charge pump 11, thereby generating a negative voltage source NVpp.

Turing back to FIG. 3, the comparator CP1 compares the output of the voltage divider 12 against the reference voltage Vref1, and delivers a H-level if the output of the voltage divider 12 is higher than the reference voltage Vref1. As a result, the charge pump 11 starts for operation to lower the negative output voltage NVpp. If the output of the voltage divider 12 is lower than the reference voltage Vref1, the comparator CP1 delivers a L-level, whereby the charge pump 11 stops the operation. In these operations, the output voltage NVpp of the negative source section 13 converges to and is maintained at −9 volts, for example, which is used for programming or erasing memory cells in the flash memory.

In the above embodiment, the source follower configuration of the impedance conversion transistor TR2, connected between the positive source line and the voltage divider 12, functions for lowering the output impedance of the positive voltage source, whereby the current flowing through the voltage divider 12 generates less change in the output voltage of the positive source section 14.

In addition, since the positive source section 14 does not include a charge pump as used in the conventional power source circuit, the output of the positive source section 14 becomes stable in a short time after the start of the power source circuit, whereby the output voltage of the negative source section 13 also becomes stable in a short time.

The impedance conversion section 15 functions for a buffer amplifier, whereby a temporary potential change of the output terminal OUT of the negative source section 13 less affects the output voltage of the positive source section 14, by limiting the influence of the change only to the output voltage of the negative source section 13. As a result, if the output negative voltage NVpp changes due to an external factor, the output negative voltage converges to the designed potential in a short time.

The functions of the voltage compensation section 16 is more specifically described hereinafter. In the positive source section 14, the potential of the inverting input of the differential amplifier 18 converges exactly to the reference voltage Vref2 by the feedback loop including the differential amplifier 18. Thus, the output potential of the positive source section 14 is equal to the sum of the reference voltage Vref2 and the voltage drop across the resistor R3 and the threshold voltage Vth of the voltage compensating transistor TR3. Therefore, the source potential of the transistor TR2 of the impedance conversion section 15 is equal to the output of the positive source section 14 minus the threshold voltage Vth of the transistor TR2, which is designed equal to the threshold voltage of the transistor TR3. Thus, the output potential of the impedance conversion section 15 is equal to the threshold voltage Vth plus the voltage drop across the resistor R3, and does not fluctuate irrespective of the process conditions of the fabrication or the ambient temperature of the power source circuit.

In the above embodiment, the voltage compensating transistor TR3 may be omitted if the variation of the threshold voltage Vth of the source follower transistor TR2 of the impedance conversion section 15 is negligibly small. In this case, the dividing ratio of the resistors R3 and R4 may be changed in consideration of reduction in the output potential of the transistor TR2 by the threshold Vth, thereby maintaining the potential of node "A" equal to the case of the illustrated embodiment.

In the above embodiment, a positive voltage source is provided to the power source circuit from outside the semiconductor device, whereby the control unit 10 and the differential amplifier 18 operate on the positive voltage source to generate a negative output voltage. On the contrary, if a negative voltage source is supplied to the power source circuit from outside the semiconductor device, the control unit 10 and the differential amplifier 18 are designed to operate on the negative voltage source to generate a positive output voltage together with a charge pump. In addition, the MOS transistors as used in the embodiment may be replaced by bipolar transistors. In this case, the terms "drain", "gate" and "source" as used in this text refer to collector, base and emitter of the bipolar transistor. Accordingly, for example, the impedance conversion section 15 may be an emitter follower transistor instead of the source follower transistor.

Since the above embodiment is described only for an example, the present invention is not limited to the above embodiment and various modifications or alterations can be easily made therefrom by those skilled in the art without departing from the scope of the present invention.

What is claimed is:

1. A power source circuit comprising a first source section for generating a first voltage source having a first polarity, a second source section for generating a second voltage source having a second polarity opposing said first polarity, an impedance converter for receiving said second voltage source to generate a third voltage source having an output impedance different from an output impedance of said first voltage source, a first voltage divider for dividing a voltage difference between said third voltage source and said first voltage source to generate a first divided voltage having said second polarity, and a control unit for controlling a voltage of said first voltage source by maintaining said first divided voltage at a first reference voltage.

2. The power source circuit as defined in claim 1, wherein said second source section comprises a second voltage divider for dividing said second voltage source to generate a second divided voltage, and a differential amplifier for controlling a voltage of said second voltage source by maintaining said second divided voltage at a second reference voltage.

3. The power source circuit as defined in claim 2, wherein said impedance converter is implemented by a source follower or an emitter follower transistor.

4. The power source circuit as defined in claim 3, further comprising a voltage compensating transistor connected between an output line delivering said second voltage source and said second voltage divider.

5. The power source circuit as defined in claim 1, wherein said first source section comprises a charge pump.

6. The power source circuit as defined in claim 1, wherein said first polarity is a negative polarity.

\* \* \* \* \*